United States Patent [19]

Szczyrbowski et al.

[11] Patent Number: 5,126,032

[45] Date of Patent: Jun. 30, 1992

[54] PROCESS AND APPARATUS FOR REACTIVELY COATING A SUBSTRATE

[75] Inventors: Joachim Szczyrbowski, Goldbach; Stephan Roegels, Rodenbach, both of Fed. Rep. of Germany

[73] Assignee: Leybold Aktiengesellschaft, Hanau, Fed. Rep. of Germany

[21] Appl. No.: 660,476

[22] Filed: Feb. 25, 1991

[30] Foreign Application Priority Data

Dec. 31, 1990 [DE] Fed. Rep. of Germany ....... 4042289

[51] Int. Cl.[5] ............................................. C23C 14/34
[52] U.S. Cl. .......................... 204/298.08; 204/192.12; 204/298.14; 204/298.19
[58] Field of Search ...................... 204/192.12, 298.08, 204/298.12, 298.14, 298.19, 298.06

[56] References Cited

U.S. PATENT DOCUMENTS

| | | | |
|---|---|---|---|
| 3,887,451 | 7/1975 | Cuomo et al. | 204/298.08 X |
| 4,131,533 | 12/1978 | Bialko et al. | 204/298.14 |
| 4,931,169 | 6/1990 | Scherer et al. | 204/298.11 |

FOREIGN PATENT DOCUMENTS

221202 4/1985 German Democratic Rep.

*Primary Examiner*—Nam Nguyen
*Attorney, Agent, or Firm*—Felfe & Lynch

[57] ABSTRACT

An apparatus for the reactive coating of a substrate 1 with an electrically insultive material, silicon dioxide $SiO_2$, for example, comprises a power supply 10 connected to a cathode 5 which is disposed in an evacuable coating chamber 15, 15a and surrounds the magnets 7, 8, 9. This cathode electrically interacts with the target 3 which is sputtered and the sputtered particles thereof are deposited on the substrate 1. A process gas and a reactive gas, e.g. argon with oxygen, are introduced into the coating chamber 15, 15a. The apparatus comprises two electrodes 44, 5 which are electrically insulated from one another and from the sputtering chamber 25. The one electrode is a magnetron cathode 5 where the cathode base 11 and the material of the target 3 are electrically connected to each other and the other electrode functions as an anode 44 in the plasma discharge. Provision is made for a DC power supply 10 which has an electrically floating output and the negative pole thereof, with a throttle 45 being interposed and a resistor 46 parallel to it, is connected to cathode 5 and the positive pole thereof via line 40 to anode 44. In order to achieve a stable coating process, a first low-induction, HF-suitable capacitor 34 is inserted between cathode 5 and anode 44 and a second low-induction capacitor 35 between anode 44 and the electrically insulated vacuum chamber 25.

6 Claims, 2 Drawing Sheets

PROCESS AND APPARATUS FOR REACTIVELY COATING A SUBSTRATE

BACKGROUND OF THE INVENTION

The invention concerns an apparatus for reactively coating a substrate, with silicon dioxide ($SiO_2$) for example. It comprises a power supply which is connected to an electrode disposed in an evacuable coating chamber. This electrode is electrically connected to a target which is sputtered. The sputtered articles are deposited on the substrate while a process gas and a reactive gas are supplied to the coating chamber.

In known processes for coating substrates by means of cathode sputtering where materials with a high affinity for the reactive gas are used, the problem arises that not only the substrate but also parts of the apparatus like the inner wall of the process chamber or parts of diaphragms are coated with materials of no or poor electrical conductivity. This requires a frequent change of process parameters during one single coating procedure or even a frequent interruption of the process and even a frequent cleaning or replacement of parts of the apparatus. In particular, it leads to highly undesired electric discharges (arcings).

The present invention provides an apparatus for sputtering materials with a high affinity for the reactive gas. This process should be stable and free of arcings and render a cleaning of parts superfluous. Conventional and presently existing apparatus, however, should also be suitable for this purpose without requiring essential or expensive modifications and changes. Moreover, the apparatus should operate trouble-free especially over longer periods even when insulating layers like $SiO_2$, $Al_2O_3$, $NiSi_2$-oxide, $ZrO_2$, $TiO_2$, $ZnO$, $Ta_2O_3$, $SnO_2$ are reactively deposited.

This object is accomplished in the invention by providing two electrodes which are electrically insulated from one another and from the sputtering chamber. One of the electrodes is a magnetron cathode where the cathode base and the target material are electrically connected to one another. The other electrode functions as an anode in the plasma discharge. Provision is made for a power supply for direct current which has an electrically floating output. The negative pole thereof, with a throttle being interposed is connected to the cathode and its positive pole is connected to the anode. A first low-induction, HF-suitable capacitor is interposed between the cathode and the anode, and a second low-induction, HF-suitable capacitor is interposed between the anode and the first electrically insulated vacuum chamber.

An alternative embodiment of the invention has a cathode with an annular or oval target. This cathode is electrically insulated from the vacuum chamber and the anode. It is configured as a magnetron cathode and is composed of two parts which are electrically insulated from one another. The target base inclusive of yoke and magnet is the one part. It is connected to the negative pole of a DC power supply with a capacitor being interposed. The target is the other part and it is connected to the DC power supply via a line where a throttle and a resistor parallel thereto are interposed. Via another capacitor, the target is connected to the positive pole of the power supply and to the anode which in turn is connected to ground. Interposed therein are a capacitor and a resistor downstream of it.

DETAILED DESCRIPTION OF THE PREFERRED EMBODIMENT

Figure 1:
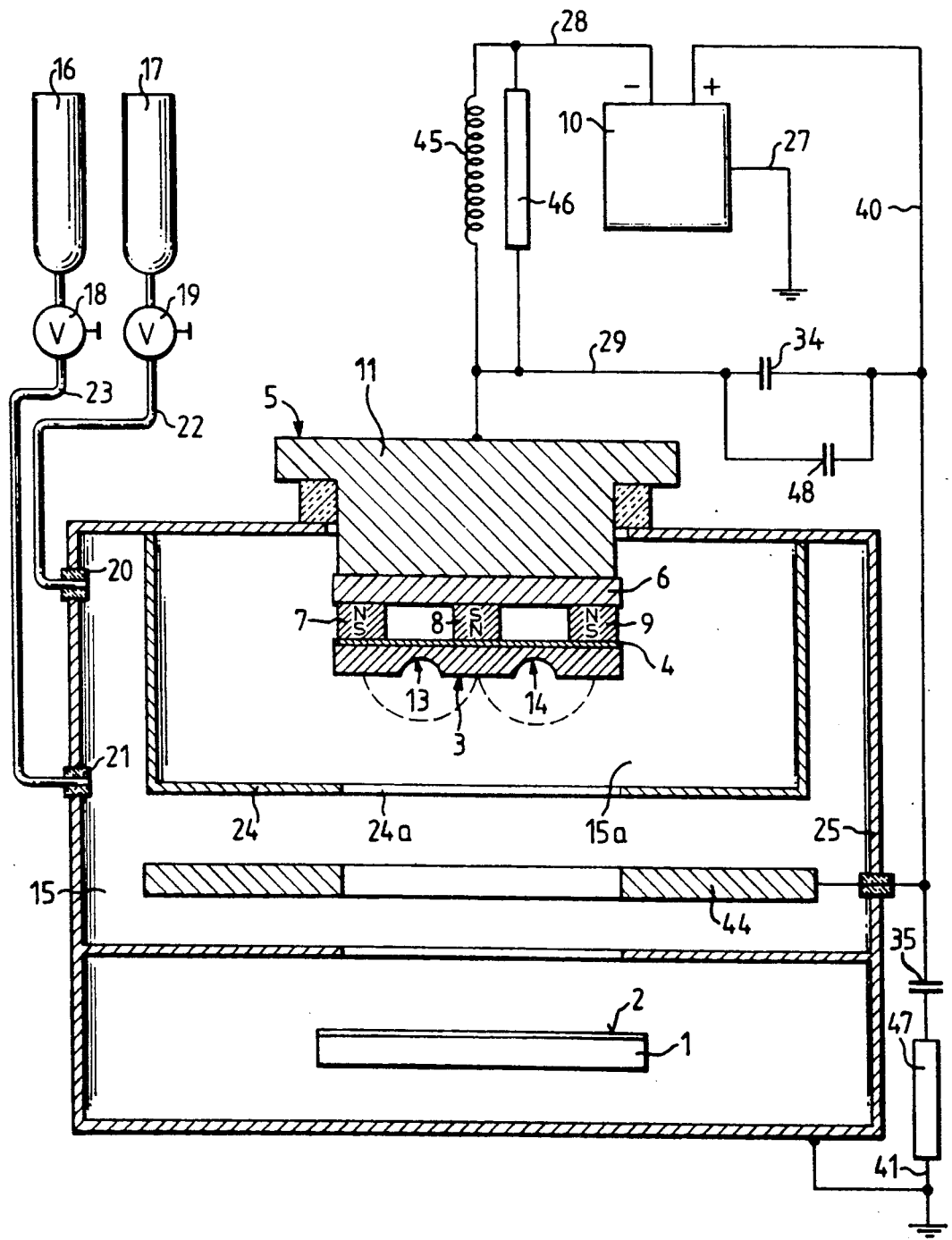
FIG. 1 is a diagrammatic section of a first embodiment of the magnetron cathode sputtering apparatus

In FIG. 1, a substrate 1 to be coated with a thin oxide layer 2 (e.g. silicon dioxide or aluminum dioxide) is situated opposite a target 3. A plate 4 connects this target 3 to an electrode 5 which rests on a yoke 6. Between itself and element 4, the yoke encloses magnets 7, 8, 9.

The polarities of the poles of the magnets 7, 8, 9 focussed onto target 3 alternate so that the south poles of the two outer magnets 7, 9 together with the north pole of the inner magnet 8 produce a magnetic field of an approximately circular arc form through the target. These magnetic fields condense the plasma in front of target 3 so that it reaches its greatest density where the magnetic fields reach their maximum values. The ions in the plasma are accelerated by an electric field generated by a direct voltage which is supplied by a DC power supply 10. Line 28 connects the negative pole of this DC power supply 10 to electrode 5. A throttle 45 and a resistor switched parallel to the throttle are interposed in the line. The electric field stands perpendicularly on the surface of target 3 and accelerates the positive ions of the plasma toward this target 3. A more or less great number of atoms or particles is thus ejected from target 3, in particular from areas 13, 14. The sputtered atoms or particle travel predominantly toward substrate 12 where they are deposited as a thin layer 2.

In the apparatus of FIG. 1, line 28 is connected to a line 40 via a branch line 29 in which there are interposed a capacitor 34 and another capacitor 48 switched parallel to first one. The line 40 connects the positive pole of the DC power supply 10 to anode 44. Another branch line 41 connects vacuum chamber 25 and line 40 to ground. Interposed in this line are a capacitor 35 and a resistor downstream 47 of it.

Target 3 can be made of a material with a high affinity for the reactive gas, for example Si. During the sputtering process, this configuration and material selection, the corresponding magnetic fields and a selected ratio of oxygen to argon ensure that a layer 2 of $SiO_2$ (silicon dioxide) is produced on substrate 1.

A process computer which calculates the measured data and releases control commands is provided for the control of the represented arrangement. The values of the partial pressure measured in process chamber 15, 15a can be fed to this process computer. Based on this and other data, it can control the gas flow from cylinders 16, 17 via valves 18, 19 and also adjust the voltage at cathode 5. The process computer is also capable of controlling all other variables, e.g. the cathode current and the magnetic field strength. Since process computers of this kind are known, a description of its design is omitted here.

Figure 2:
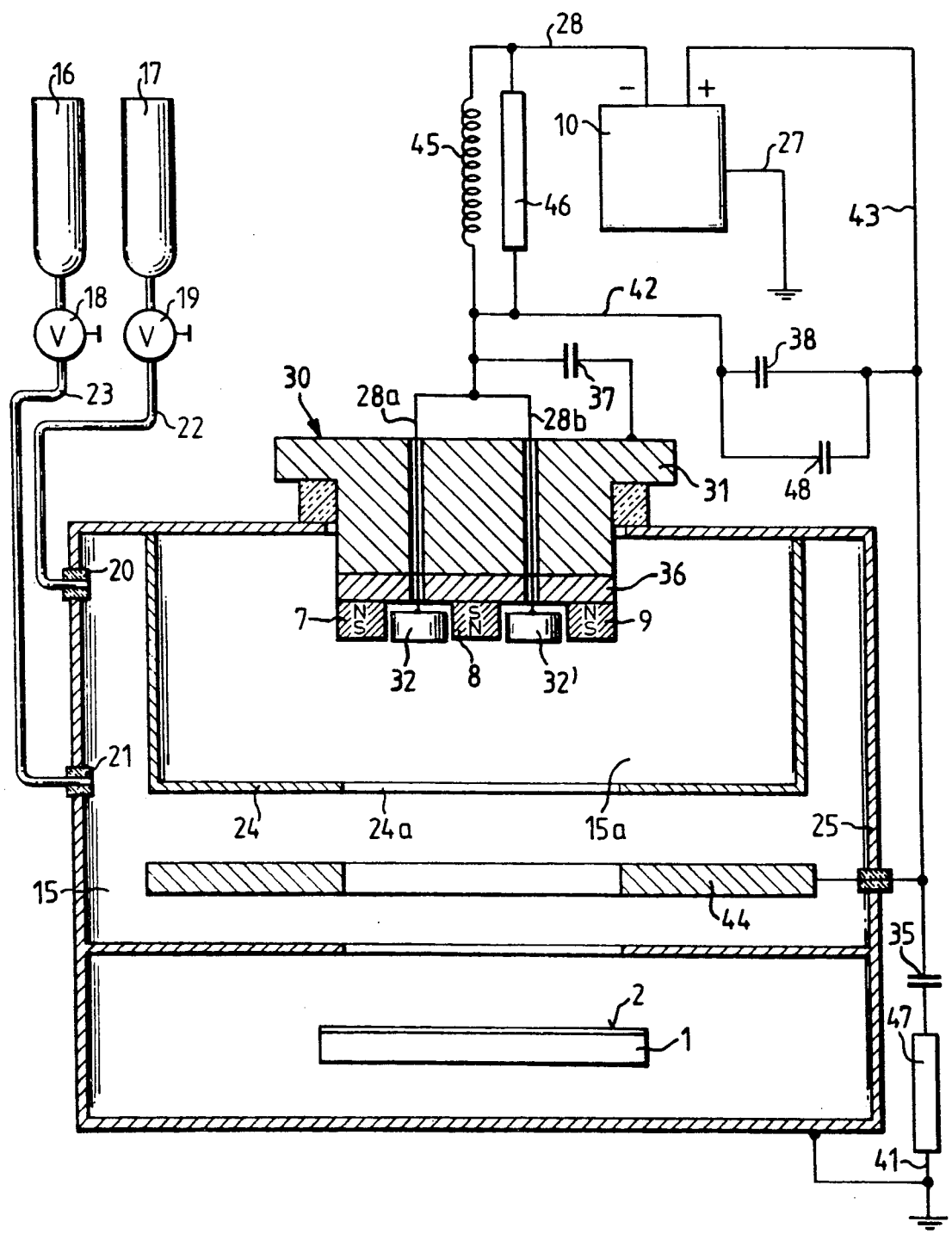
FIG. 2 is a diagrammatic section of a second embodiment of the magnetron cathode sputtering apparatus

In the embodiment of FIG. 2, the cathode 30 includes a base 31 and a yoke 36 which supports magnets 7, 8, 9 arranged to accommodate an oval target 32, 32'. The target is connected to the negative pole of the DC power supply 10 via line 28 and branch lines 28a, 28b. Interposed therein are a throttle 45 and a resistor 46 parallel to this throttle. Another branch line 42, with a capacitor 38 inserted in it and another capacitor 48 parallel to the first capacitor 38, is connected to line 43. The latter connects the positive pole of the DC power supply 10 to anode 44 which in turn is connected to ground via branch line 41 with a capacitor 35 interposed. Also, a resistor 47 is inserted downstream of this capacitor 35.

In order to accomplish the above object (FIG. 1), a sputtering apparatus hence has two electrodes 5 and 44 which are electrically separate from one another and from the sputtering chamber 25. The one electrode is a magnetron cathode 5 and the other electrode is used as an anode 44 for the plasma discharge. Moreover, the sputtering apparatus has:

a. a DC power supply 10 with an electrically floating output. The negative pole of this power supply is, via a throttle 45, connected to cathode 5 and the positive pole thereof is connected to anode 44, b. a resistor 46 parallel to this throttle 45, c. a low-induction, HF-suitable capacitor 34 inserted between cathode 5 and anode 44 and d. a capacitor 35 between anode 44 and the electrically separate sputtering chamber 25 and a resistor 47 parallel to this capacitor 35.

In an alternative embodiment of a sputtering apparatus (FIG. 2) where the cathode comprises two electrically separate parts, namely the one part which is the actual target (e.g. the target material 32, 32' together with the target carrier) and a second part, cathode base 31 and yoke 36 (the actual target is electrically separate from the yokes, magnets and pole shoes), a low-induction capacitor 37 is inserted between the (oval) target 32, 32' and the electrically separate target surroundings.

It is the task of capacitor 34 and/or 38 to short-circuit the high frequency voltage oscillations and current oscillations which are induced by the sputtering process and lead to flash-overs and arcings.

In a DC sputtering process, plasma oscillations can be generated at very high frequencies (MHz to GHz) which usually lead to instantaneous and local voltage surges. These surges can partly be higher than the so called breakthrough voltage for the given cathode-anode configuration. These local excessive voltages lead to electrical flash-overs and arcings. It is the purpose of the capacitors 34 and 38 to short circuit these excessive voltages.

The task of the throttle inductor 45 is to drastically reduce the cathode voltage during the short-circuit to thus permit the elimination of a possible arcing.

Inductor 45 and capacitors 34 and 38 and the corresponding electrical components produce an electrical oscillating circuit. This electrical oscillating is undesired and suppressed by resistor 46.

Capacitor 35 is of particular importance when, during the reactive coating, an electrically insulating layer is produced which also grows on the counter electrode (anode). A coating on the positive electrode with an electrically insulating layer that grows with an increasing sputtering time can significantly impair a re-ignition of the sputtering plasma. The task of this capacitor 35 is to facilitate a re-ignition of the sputtering plasma after an intended or accidental shut-down of the power supply.

When those surfaces of the anode 44 which are closest to the cathode are coated with an electrically insulating layer, the ignition voltage in the sputtering chamber 25, which is electrically separate from electrodes 5, 30, increases. The larger the coated surface, the higher is the ignition voltage and after a certain coating, the latter voltage exceeds the voltage limit of the power supply. Since there is always a finite probability of an accidental shut-down of the cathode voltage, this would lead to an interruption of the plasma process after a certain sputtering time. When a capacitor 35 is interposed between anode 44 and ground, i.e. between anode 44 and chamber walls 25 (which are grounded), the entire chamber 25 functions as an anode at the moment of ignition. When a DC power supply is turned on, the voltage of capacitor 35 increases rapidly in a very short period of time. This leads to a displacement current across the capacitor (a capacitor is short-circuited for high frequencies). This effect puts the ignition voltage practically to a value which would be generated when anode 44 were directly connected to chamber wall 25.

Capacitor 35 with its self-inductance and the capacitors and inductors of the supply lines 43, 41 also function as an oscillating circuit. This oscillating circuit is attenuated by resistor 47.

In order to obtain a long-term stable process, it is necessary to take measures which impede or even prevent a coating of anode 44 with an insulating layer.

Finally, the task of capacitor 37 is to reduce or even completely eliminate the occurrence of random electrical flash-overs between target 32, 32' and the target surrounding, i.e. cathode base 31 and yoke 36.

Embodiment according to FIG. 1

| Standard Planar Magnetron Cathode: | |
| --- | --- |
| Cathode length | 750 mm |
| Cathode width | 280 mm |
| LH-power supply | 30 kW |
| Dimensional arrangement of electrical components: | |
| 45 | 1 mH |
| 46 | 100 Ω |
| 34 | 2 μF |
| 47 | 100 Ω |
| 35 | 2 μF |
| 48 | 20 nF |

In the practice, a relative great capacity (some μF) can lose its capacitative properties during high frequencies and often has a very high self-inductance. It is therefore the task of the capacitor 48 to reduce the high self inductance and the accompanying high inductive resistance of capacitor 34.

Embodiment according to FIG. 2:

| ZPT cathode (between pole - target) | |
| --- | --- |
| Cathode length | 750 mm |
| Cathode width | 260 mm |
| LH power supply | 30 kW |
| Dimensional arrangement of the electrical components: | |
| 45 | 1 mH |
| 46 | 100 Ω |
| 38 | 3 nF |
| 47 | 100 Ω |
| 35 | 2 μF |
| 37 | 1 μF |
| 48 | 20 nF |

We claim:

1. Apparatus for the reactive coating of a substrate with electrically insulative material, comprising a D.C. power supply having a positive pole, a negative pole, and an electrically floating output, an evacuable coating chamber, means for introducing a process gas into said chamber, means for introducing a reactive gas into said chamber, a target of electrically conductive material, a magnetron cathode disposed in said chamber and electrically insulated therefrom, said cathode being connected to said negative pole of said D.C. power supply via an inductance and a first resistor arranged in parallel, said cathode being arrange to attract electrically charged particles toward said target, an anode disposed in said chamber and electrically insulated therefrom, said anode being electrically connected to said positive pole, first electrical connection means connecting said cathode to said anode and comprising a first capacitance between said cathode and said anode, and second electrical connection means connecting said anode to ground and comprising a second capacitance and a second resistor arranged in series.

2. Apparatus as in claim 1 wherein said cathode is directly connected to said inductance and said first resistor which are arranged in parallel.

3. Apparatus as in claim 2 wherein said cathode is electrically connected to said target, said first electrical connection means further comprising said cathode.

4. Apparatus as in claim 1 wherein said evacuable chamber is connected directly to ground.

5. Apparatus as in claim 1 wherein said first electrical connection means further comprises a third capacitance between said cathode and said inductance and first resistor.

6. Apparatus as in claim 5 wherein said target is directly connected to said inductance and said first resistance which are arranged in parallel, said target being electrically insulated from said cathode but for said third capacitance.

* * * * *